United States Patent
Iwai

(10) Patent No.: US 8,724,383 B2
(45) Date of Patent: May 13, 2014

(54) NONVOLATILE SEMICONDUCTOR MEMORY DEVICE

(75) Inventor: Hitoshi Iwai, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 209 days.

(21) Appl. No.: 13/358,648

(22) Filed: Jan. 26, 2012

(65) Prior Publication Data

US 2012/0195120 A1   Aug. 2, 2012

(30) Foreign Application Priority Data

Feb. 1, 2011   (JP) .................................. 2011-019627

(51) Int. Cl.
*G11C 11/34* (2006.01)

(52) U.S. Cl.
USPC ............ 365/185.03; 365/185.09; 365/185.17; 365/185.18; 365/185.22; 365/185.24; 365/185.29; 365/185.33

(58) Field of Classification Search
USPC ............. 365/185.03, 185.09, 185.17, 185.18, 365/185.22, 185.24, 185.29, 185.33
See application file for complete search history.

(56) References Cited

U.S. PATENT DOCUMENTS

| 6,498,752 | B1 * | 12/2002 | Hsu et al. | 365/185.22 |
| 6,847,554 | B2 * | 1/2005 | Satori | 365/185.09 |
| 7,385,849 | B2 * | 6/2008 | Koga et al. | 365/185.22 |
| 8,120,959 | B2 * | 2/2012 | Lee et al. | 365/185.17 |
| 2007/0252201 | A1 | 11/2007 | Kito et al. | |

* cited by examiner

*Primary Examiner* — Trong Phan
(74) *Attorney, Agent, or Firm* — Oblon, Spivak, McClelland, Maier & Neustadt, L.L.P.

(57) ABSTRACT

A control circuit controls erase operation to erase data of memory transistors, correction write operation, and correction write verify operation. In the correction write operation, a erase threshold level of a memory transistor is moved to a positive threshold level after the erase operation. In the correction write verify operation, whether or not a threshold level of the result of the correction write operation reaches a first value is determined. In the correction write operation, the control circuit executes the correction write operation with respect to plural memory units connected to a common one of the bit lines as a group. The control circuit sequentially executes the correction write verify operation with respect to plural memory units in which the correction write operation is executed.

18 Claims, 10 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2011-19627, filed on Feb. 1, 2011, the entire contents of which are incorporated herein by reference.

FIELD

An embodiment described in the present specification relates to a nonvolatile semiconductor memory device which can electrically rewrite data.

BACKGROUND

Recently, planar miniaturization process is becoming difficult, and as a result, many stacked semiconductor memory devices in which memory transistors are three-dimensionally arranged have been proposed. Such a semiconductor memory device comprises a columnar semiconductor layer extending in a vertical direction with respect to a substrate and plural conductive layers surrounding a side surface of the columnar semiconductor layer through an insulating film and a charge accumulation layer. The columnar semiconductor layer functions as a body (channel) of plural memory transistors. The conductive layers each function as a control gate of the memory transistor.

However, in the stacked semiconductor memory device, after the conductive layer constituting the control gate and a select gate, and the insulating layer are alternately stacked, a memory hole is formed. Then, a MONOS film, for example, is formed in the hole, and therefore, because of its structure, only one charge accumulation layer is commonly provided with respect to the plural conductive layers. Accordingly, charge movement easily occurs between the memory transistors adjacent to each other, and there is a problem that data is not satisfactorily held. Thus, it is considered to adjust a threshold level of erasing and thereby improve data retention characteristics, in this case however, there is a problem that erase operation takes a long time.

DETAILED DESCRIPTION

A nonvolatile semiconductor memory device according to one embodiment has a memory unit which has memory transistors and select transistors. A bit line is connected to one end of the memory unit, a word line is connected to a control gate of the memory transistor, and a control gate line is connected to a gate of the select transistor. A control circuit controls erase operation to erase data of the memory transistors, correction write operation, and correction write verify operation. In the correction write operation, a erase threshold level of the memory transistor is moved to a positive threshold level after the erase operation. In the correction write verify operation, whether or not a threshold level of the result of correction writing reaches a first value is determined. In the correction writing, the control circuit executes the correction writing with respect to plural memory units connected to a common bit line as a group. The control circuit sequentially executes the correction write verify operation with respect to plural memory units in which the correction writing is executed.

Hereinafter, an embodiment of a nonvolatile semiconductor memory device will be described with reference to the drawings.

First Embodiment

Figure 1:
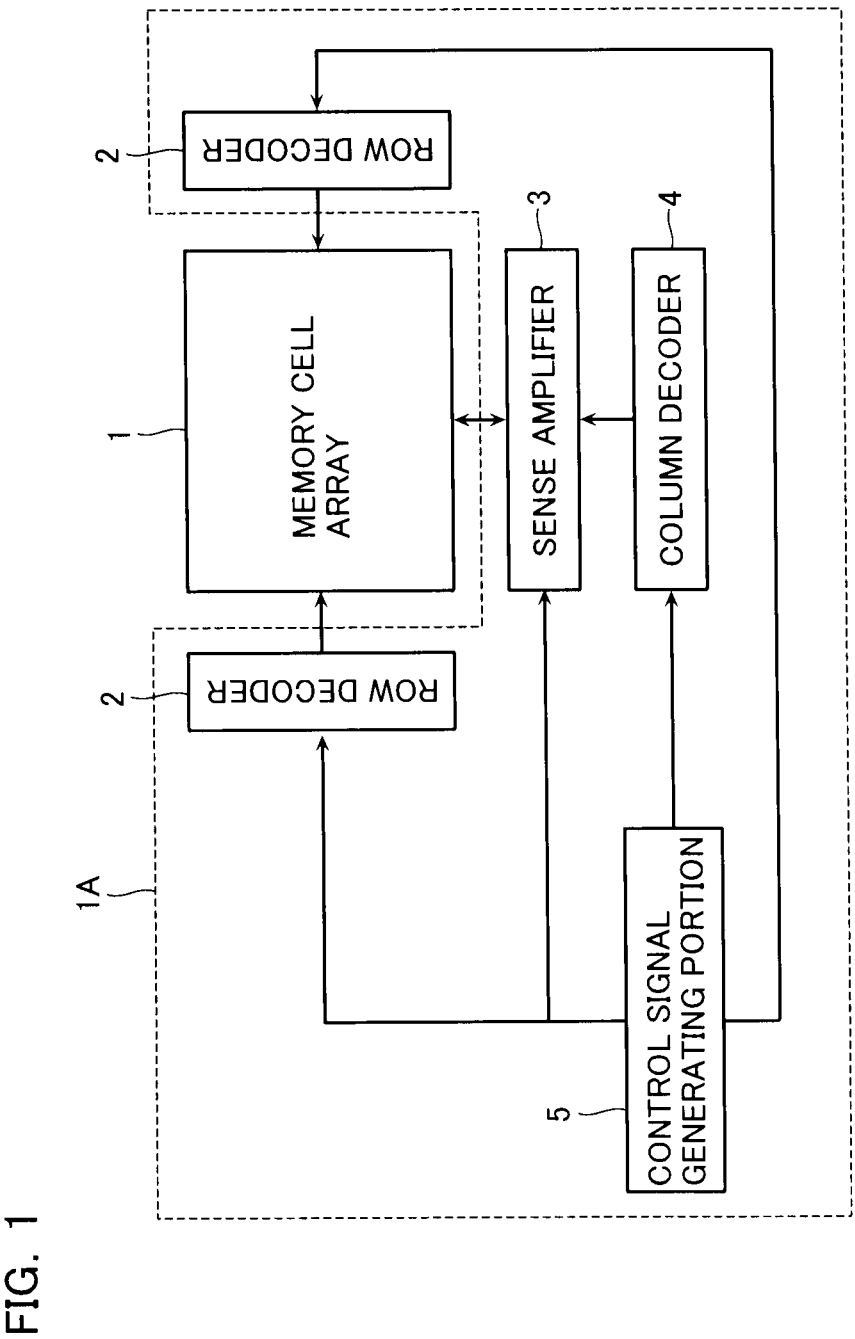
FIG. 1 is a block diagram of a nonvolatile semiconductor memory device according to a first embodiment.

First, a configuration of a nonvolatile semiconductor memory device according to a first embodiment will be described with reference to FIG. 1. As shown in FIG. 1, the nonvolatile semiconductor memory device according to the first embodiment has a memory cell array 1 and a control circuit 1A.

The memory cell array 1 is configured so that plural memory transistors electrically storing data in a nonvolatile manner are arranged in the form of a three-dimensional matrix. The specific circuit configuration and the laminate structure will be described later.

The control circuit 1A controls a voltage applied to the memory cell array 1. The control circuit 1A includes a row decoder 2, a sense amplifier 3, a column decoder 4, and a control signal generating portion 5. The row decoder 2 decodes a captured block address signal and so on and controls the memory cell array 1, as shown in FIG. 1. The row decoder 2 controls a voltage of a word line WL, a source-side select gate line SGS, and a drain-side select gate line SGD, to be hereinafter described, based on a signal supplied from the sense amplifier 3.

The sense amplifier 3 reads out data from the memory cell array 1. The column decoder 4 decodes a column address signal and controls the sense amplifier 3. The control signal generating portion 5 boosts a reference voltage to generate a high voltage required in writing and erasing and further generates a control signal to control the row decoder 2, the sense amplifier 3, and the column decoder 4.

Figure 2:
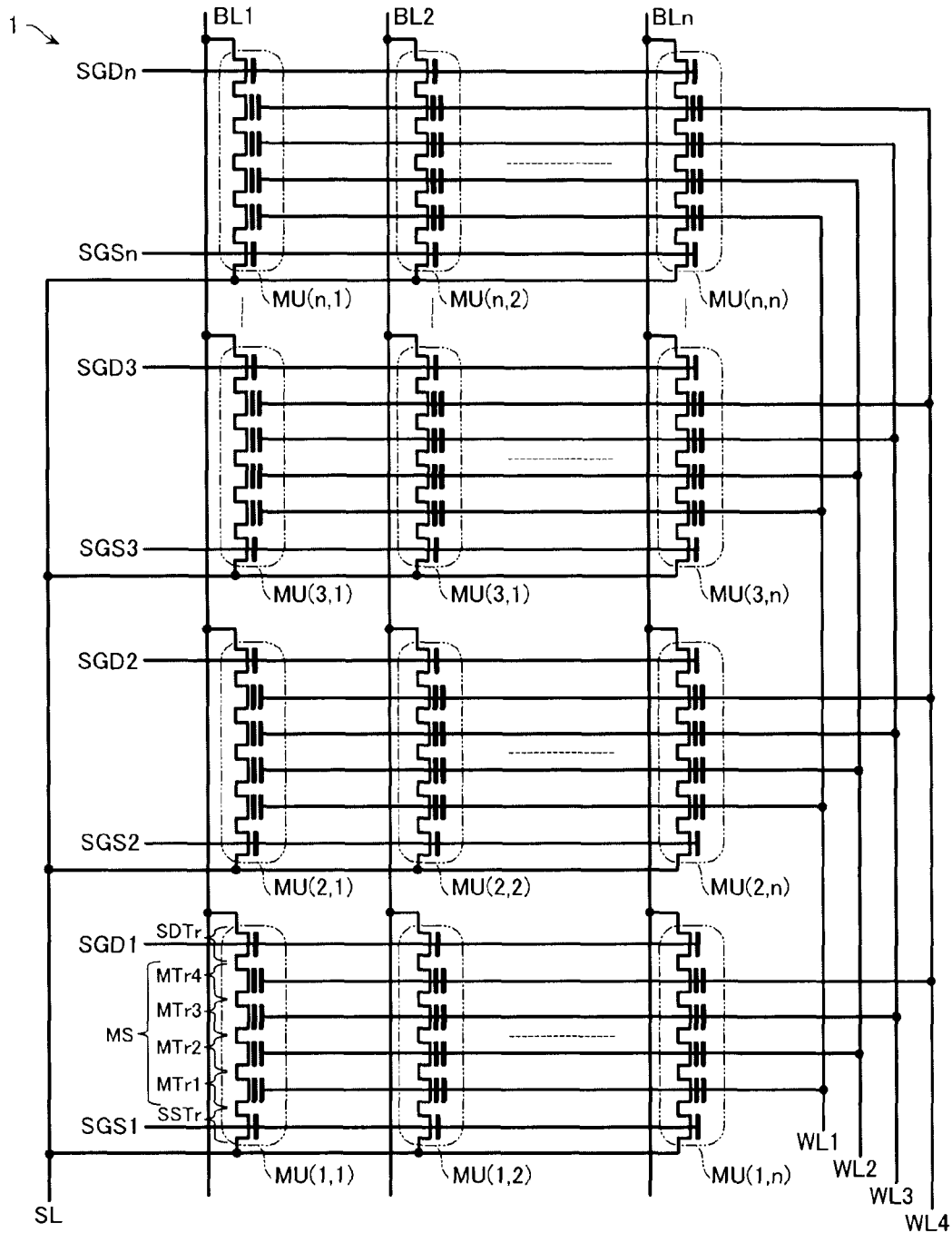
FIG. 2 is a circuit diagram of a memory cell array 1 according to the first embodiment.

Next, a circuit configuration of the memory cell array 1 will be described with reference to FIG. 2. As shown in FIG. 2, the memory cell array 1 has bit lines BL1 and BL2 to BLn (collectively referred to as "BL"), a source line SL, and memory units MU(1, 1) to MU(n, n) (collectively referred to as "MU").

The bit line BL is connected to drains of the cell units MU. The bit line BL is provided to extend in a column direction at a predetermined pitch in a row direction. The source line SL is commonly connected to sources of the plural cell units MU.

In the example shown in FIG. 2, the memory units MU are provided in the form of a matrix over n rows by n columns. The memory unit MU has a memory string MS, a drain-side select transistor SDTr, and a source-side select transistor SSTr.

The memory string MS is constituted of plural memory transistors MTr1 to MTr4 (four memory transistors are provided in the illustrated example and collectively referred to as "MTr") connected in series. In the memory transistors MTr1 to MTr4, when the charge amount accumulated in charge accumulation layers thereof is changed, the threshold voltage is changed. The threshold voltage is changed, whereby data held in the memory transistors MTr1 to MTr4 are rewritten.

The drain-side select transistor SDTr is connected between the drain of the memory string MS (drain of the memory transistor MTr4) and the bit line BL. The source-side select transistor SSTr is connected between the source of the memory string MS (source of the memory transistor MTr1) and the source line SL.

Gates of the memory transistors MTr1 to MTr4 are connected respectively to word lines WL1 to WL4 (collectively referred to as "WL").

Gates of the drain-side select transistors SDTr of the memory units MU(1, 1) and MU(1, 2) to MU(1, n) arranged in a row in the row direction are commonly connected to a drain-side select gate line SGD1. Similarly, gates of the drain-side select transistors SDTr of memory units MU(2, i) and MU(3, i) to MU(n, i) are commonly connected to drain-side select gate lines SGD2 and SGD3 to SGDn, respectively.

Gates of the source-side select transistors SSTr of the memory units MU(1, 1) and MU(1, 2) to MU(1, n) arranged in a row in the row direction are commonly connected to a source-side select gate line SGS1. Similarly, gates of the source-side select transistors SSTr of the memory units MU(2, i) and MU(3, i) to MU(n, i) are commonly connected to source-side select gate lines SGS2 and SGS3 to SGSn.

Figure 3:
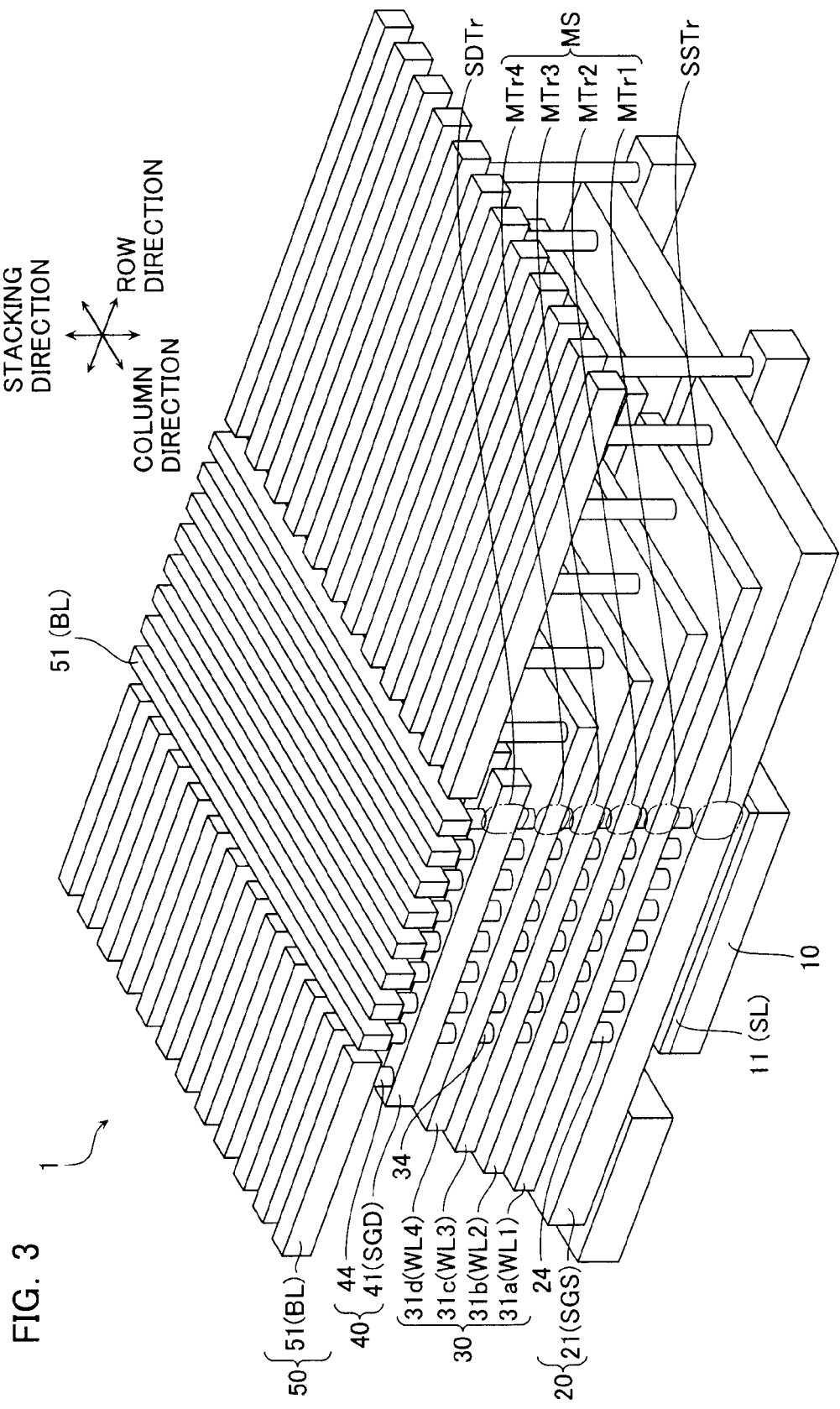
FIG. 3 is a perspective view of the memory cell array 1 according to the first embodiment.
Figure 4:
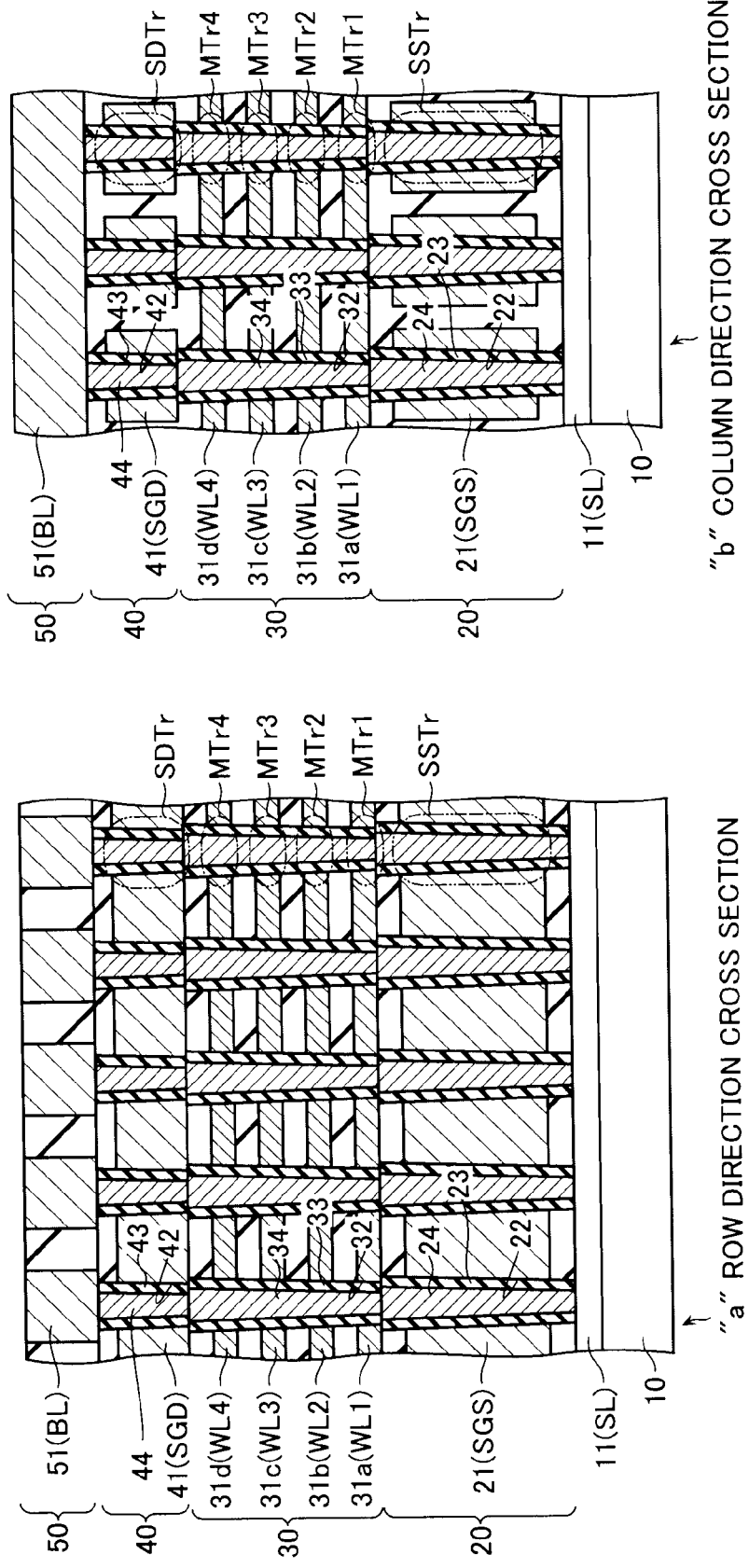
FIG. 4 is a cross-sectional view of the memory cell array 1 according to the first embodiment.

The circuit configuration of the above nonvolatile semiconductor memory device is realized by a laminate structure shown in FIGS. 3 and 4, for example. "a" of FIG. 4 shows a row direction cross section of FIG. 3, and "b" of FIG. 4 shows a column direction cross section of FIG. 3. In this example, the memory cell array 1 has a semiconductor substrate 10, a source-side select transistor layer 20, a memory layer 30, a drain-side select transistor layer 40, and a wiring layer 50 sequentially stacked on the semiconductor substrate 10.

The semiconductor substrate 10 has a diffusion layer 11 on its upper surface, and the semiconductor substrate 10 and the diffusion layer function as the source line SL. The source-side select transistor layer 20 functions as the source-side select transistor SSTr. The memory layer 30 functions as a memory string MS (memory transistors MTr1 to MTr4). The drain-side select transistor layer 40 functions as the drain-side select transistor SDTr. The wiring layer 50 functions as the bit line BL and other various wirings.

As shown in FIGS. 3 and 4, the source-side select transistor layer 20 is formed in an insulating layer stacked on the semiconductor substrate 10. The source-side select transistor layer 20 has plural source-side conductive layers embedded in the insulating layer. The source-side conductive layer 21 is formed of polysilicon (poly-Si), arranged at a predetermined pitch in a column direction, and formed to extend in a row direction. The source-side conductive layer 21 functions as the gate of the source-side select transistor SSTr and the source-side select gate line SGS.

As shown in FIG. 4, the source-side select transistor layer 20 has plural source-side holes 22 formed to penetrate through the insulating layer and the source-side conductive layer 21 in a stacking direction. The source-side holes 22 are formed in the form of plural matrixes in the row direction and the column direction. A source-side columnar semiconductor layer 24 formed of polysilicon (poly-Si) is embedded in the source-side hole 22 through a source-side gate insulating layer 23 formed of oxide silicon ($SiO_2$), whereby the source-side select transistor SSTr is formed. The source-side columnar semiconductor layer 24 functions as a body (channel) of the source-side select transistor SSTr.

The memory layer 30 has word line conductive layers 31a to 31d sequentially stacked on the source-side select transistor layer 20 through the insulating layer. The word line conductive layers 31a to 31d function as the gates of the memory transistors MTr1 to MTr4 and the word lines WL1 to WL4 and are formed of polysilicon (poly-Si), for example, so as to extend two-dimensionally (in a plate-like manner) in the row direction and the column direction. Plural memory holes 32 are formed at positions corresponding to the source-side select transistors SSTr so as to penetrate, in the stacking direction, through the word line conductive layers 31a to 31d stacked through those insulating layers. A memory columnar semiconductor layer 34 is embedded in the memory hole 32 through the memory gate insulating layer 33, whereby the memory transistors MTr1 to MTr4 are formed. The memory columnar semiconductor layer 34 is formed of polysilicon (poly-Si), for example, and functions as a body (channel) of the memory transistors MTr1 to MTr4.

Figure 5:
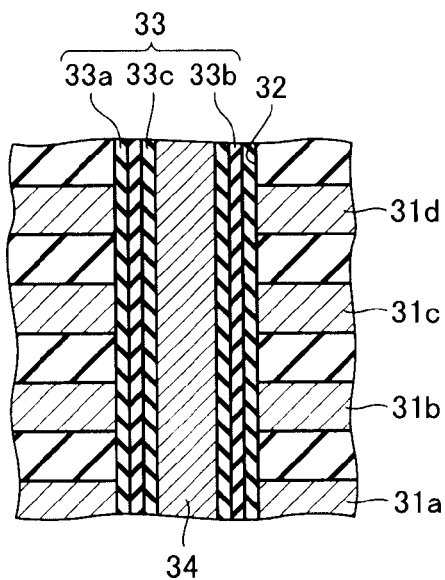
FIG. 5 is an enlarged view of FIG. 4.

The memory gate insulating layer 33 is constituted of a MONOS film, for example. FIG. 5 is an enlarged view of FIG. 4. The memory gate insulating layer 33 has a block insulating layer 33a, a charge accumulation layer 33b, and a tunnel insulating layer 33c which are each formed to have a predetermined thickness from a side surface side of the memory hole 32 to the memory columnar semiconductor layer 34. The block insulating layer 33a and the tunnel insulating layer 33c are formed of oxide silicon ($SiO_2$), and the charge accumulation layer 33b is formed of silicon nitride (SiN).

The drain-side select transistor layer 40 has plural drain-side conductive layers 41. The drain-side conductive layer 41 is formed of polysilicon (poly-Si), for example, and functions as the gate of the drain-side select transistor SDTr and the drain-side select gate line SGD.

The drain-side conductive layer 41 is arranged directly above the memory columnar semiconductor layer 34 so as to have a predetermined pitch in the column direction and formed to extend in the row direction. The drain-side select transistor layer has a drain-side hole 42 formed to penetrate through the drain-side conductive layer 41. The drain-side hole 42 is formed at a position matching the memory hole 32. A drain-side columnar semiconductor layer 44 formed of polysilicon (poly-Si) is embedded in the drain-side hole 32 through a drain-side gate insulating layer 43 formed of oxide silicon ($SiO_2$), whereby the drain-side select silicon transistor SDTr is formed. The drain-side columnar semiconductor layer 44 functions as a body (channel) of the drain-side select transistors SDTr.

The wiring layer 50 has a bit line layer 51 functioning as the bit line BL. The bit line layer is formed of metal such as tungsten, and in contact with an upper surface of the drain-side columnar semiconductor layer 44. The bit line layers 51 are arranged with a predetermined pitch in the row direction, and formed to extend in the column direction.

Figure 6:
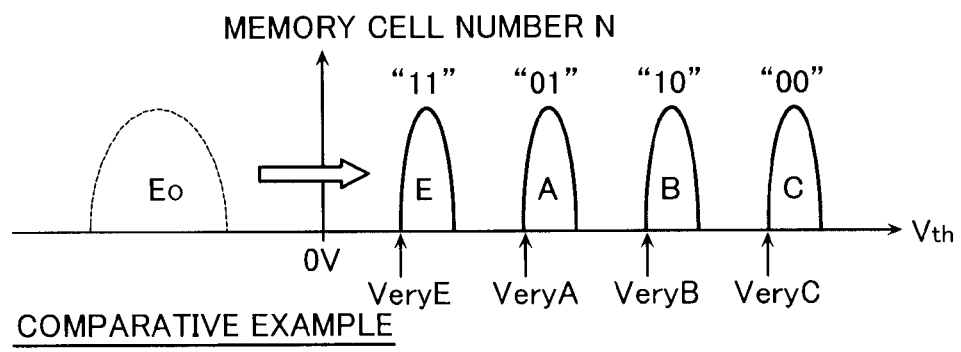
FIG. 6 is a view showing a relationship between 4-value data of 2 bits (data "11", "10", "01", and "00") stored in a memory transistor MTr and threshold voltage distribution of the memory transistor MTr.
Figure 6:
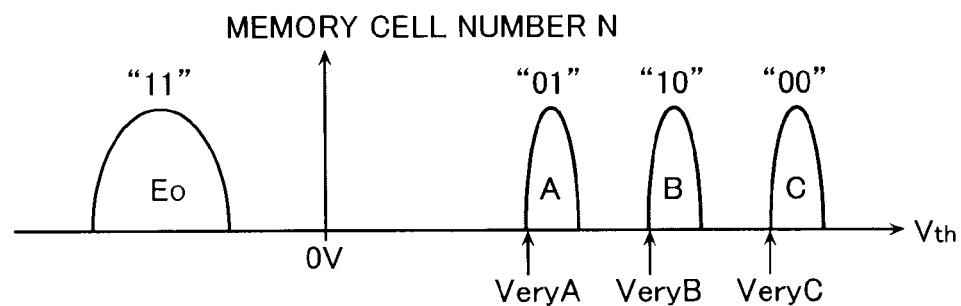

Next, data stored in the nonvolatile semiconductor memory device will be described briefly with reference to FIG. 6. When a 2-bit cell (e.g., memory cell number N) is used as an example, a threshold voltage of the memory transistor MTr is configured to allow to have distribution of four ways. FIG. 6 shows a relationship between 4-value data of 2 bits (data "11", "10", "01", and "00"), which are associated with VeryE, VeryA, VeryB, and VeryC, respectively, stored in the memory transistor MTr and the threshold voltage distribution of the memory transistor MTr. "11" shows a erase state (E, $E_O$), and "10", "01", and "00" show writing states of data A, B, and C, respectively.

In a multivalued NAND flash memory using typical two-dimensional arrangement, as shown in a comparative example, an upper limit value of threshold voltage distribution $E_O$ showing the erase state (data "11") is set to a negative value. Namely, the threshold voltage distribution $E_O$ is set by holes (carriers with a positive charge) accumulated in the charge accumulation layer. However, as in the present embodiment, in the case of the memory cell array 1 shown in FIG. 4 which has the laminate structure, in the memory transistors MTr adjacent to each other, the charge accumulation layers are continued, thereby a carrier movement easily occurs between the adjacent memory transistors MTr with the elapse of time. Accordingly, in the memory cell array 1 having the laminate structure shown in FIG. 4, when the threshold voltage distribution $E_O$ as in the comparative example is employed as the erase state (data "11"), one of the adjacent memory transistors MTr is in the erase state that the holes are accumulated, and the other is in the writing state that the electrons are accumulated. At this time, the carriers (electrons or holes) are recombined between the adjacent memory transistors MTr, thereby the data of the memory transistor MTr may be erased with the elapse of time.

Thus, in order to solve the above problem according to the comparative example, in the first embodiment, a lower limit value of threshold voltage distribution E showing the erase state ("11") is set to a positive value. Namely, the threshold voltage distribution E is set by the electrons accumulated in the charge accumulation layer. According to this constitution, in the first embodiment, even in the memory cell array 1 having the laminate structure as shown in FIG. 4, the carries are not recombined between the adjacent memory transistors MTr, and the erase of data can be suppressed. However, in this case, distribution width of the threshold voltage distribution E is required to be managed more strictly than the distribution width of the threshold voltage distribution $E_O$ so that the charge accumulation layer has no hole.

In order to set the above threshold voltage distribution E, in the erase operation in the first embodiment, after such a control that the threshold voltage distribution is set to the threshold voltage distribution $E_O$ by the erase operation, a correction write operation is executed so that the negative threshold voltage distribution $E_O$ is shifted (corrected) to the positive threshold voltage distribution E. The correction write operation may be correctively performed accompanying the erase operation or may be performed with respect to adjacent word lines WLn−1 and WLn+1 of the word line WLn, to which data will be written, at the time of data writing. The correction write operation includes a correction pulse applying operation and a correction verify operation. Hereinafter, the erase operation and the correction write operation after the erase operation will be described.

[Erase Operation]

First, the erase operation is executed so that the threshold voltage distribution is set to the threshold voltage distribution $E_O$. The erase operation is correctively performed with respect to all the memory transistors MTr of blocks to be erased. The bit line BL and the source line SL are set to VDD, the voltage VDD is applied to the drain-side select gate line SGD and the source-side select gate line SGS, thereby the select transistors SDTr and SSTr are brought into an ON state. Then, 0 V is applied to the word lines WL1 to WL4.

Consequently, while the electrons accumulated in the charge accumulation layer 33b are moved to a body of a semiconductor, the holes are accumulated in the charge accumulation layer 33b instead, and the threshold voltage distribution becomes the negative threshold voltage distribution $E_O$ as shown in FIG. 6.

Correction Write and Verify Operation

Comparative Example

Before description of correction write and verify operation according to the present embodiment, correction write and verify operation of a comparative example will be described.

In the correction writing, write voltages VprgmW1 and VprgmW2 and the following ones are applied to the memory transistors MTr so that the negative threshold voltage distribution $E_O$ becomes the positive threshold voltage distribution E. In the comparative example, the correction writing is applied simultaneously to any one of the memory units MU(k, 1) and MU(k, 2) to MU(k, n) (k is any one of 1 and 2 to n) connected to the same select gate lines SGD and SGS in FIG. 2.

Figure 7:
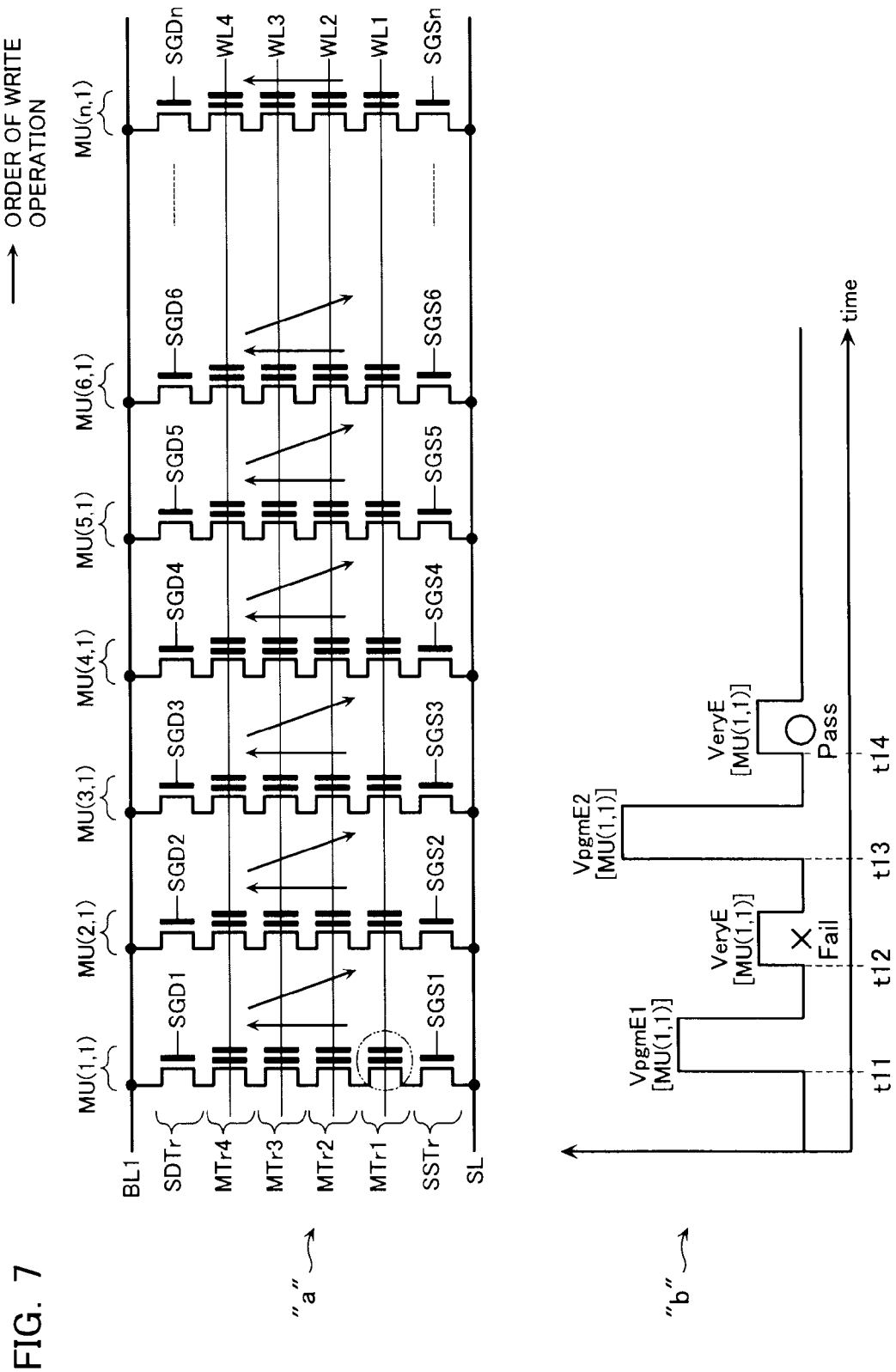
FIG. 7 is a view showing execution order of a correction write operation according to a comparative example.

"a" of FIG. 7 shows the memory units MU(1, 1) to MU(n, 1) extracted from FIG. 2 which are connected to the same bit line BL1. In this example, the correction writing is performed in order of the memory transistors MTr1, MTr2, MTr3, and MTr4 of the memory unit MU(1, 1) and the memory transistors MTr1, MTr2 and . . . of the memory unit MU(2, 1). In the correction writing of the memory transistor MTr1 of the memory unit MU(1, 1), it is necessary to note that the correction writing of the memory transistor MTr1 of the memory units MU(1, 2) to MU(1, n) is performed simultaneously with the correction writing of the memory transistor MTr1 of the memory unit MU(1, 1).

In the correction writing, the bit line BL is set to 0 V, and the voltage VDD is applied to the drain-side select gate line SGD1 to bring the drain-side select transistor SDTr into the ON state. At the same time, 0 V is applied to the other drain-side select gate lines SGD2 to SGDn, and the other drain-side select transistor SDTr is brought into an OFF state. Further, 0 V is applied to the source-side select gate lines SGS1 to SGSn, and the source-side select transistor SSTr is brought into the OFF state. Then, as shown in "b" of FIG. 7, a write voltage VpgmE1 is applied to the selected word line WL1 at a time t11, and, at the same time, a pass voltage Vpass is applied to the non-selected word lines WL2 to WL4. Consequently, the threshold voltage distribution of the memory transistor MTr1 of the memory unit MU(1, 1) is moved to the positive side.

Next, the write verify is performed. In the write verify, the voltage VDD is applied to the select gate lines SGD1 and SGS1 to bring the select transistors SDTr and SSTr into the ON state, and the other select transistors SDTr and SSTr are brought into the OFF state, so that the sense only of the memory unit MU(1, 1) is realized. In this state, a write verify voltage VeryE is applied to the selected word line WL1 at a time t12, and, at the same time, a reading pass voltage Vread is applied to the non-selected word lines WL2 to WL4. Consequently, when charge accumulated in a sense node of the sense amplifier is discharged, it is determined as fail, and when the charge is not discharged, it is determined as pass.

When a result of the write-verify reading is determined as fail, the write voltage VpgmE2 stepped up is applied to the selected word line WL1, and the correction write operation is carried on at a time t13. When a result of the write-verify reading performed at a time t14 is determined as pass, the bit line BL1 is set to a VDD level, and the subsequent writing is inhibited. When all the memory transistors MTr1 which are connected to the bit lines BL1 to BLn and are objects to be subjected to the correction writing is a pass state, the correction writing of the next memory transistor MTr2 is executed.

Correction Write and Verify Operation

First Embodiment

In the above correction write and verify operation, since the correction writing is applied only to the single memory unit MU connected to the respective bit lines BL, the correction writing takes a long time, and there is a problem that the erase operation takes a long time.

Thus, in the present embodiment, the time of the erase operation is reduced by performing the correction writing simultaneously with respect to the memory units MU.

Figure 8:
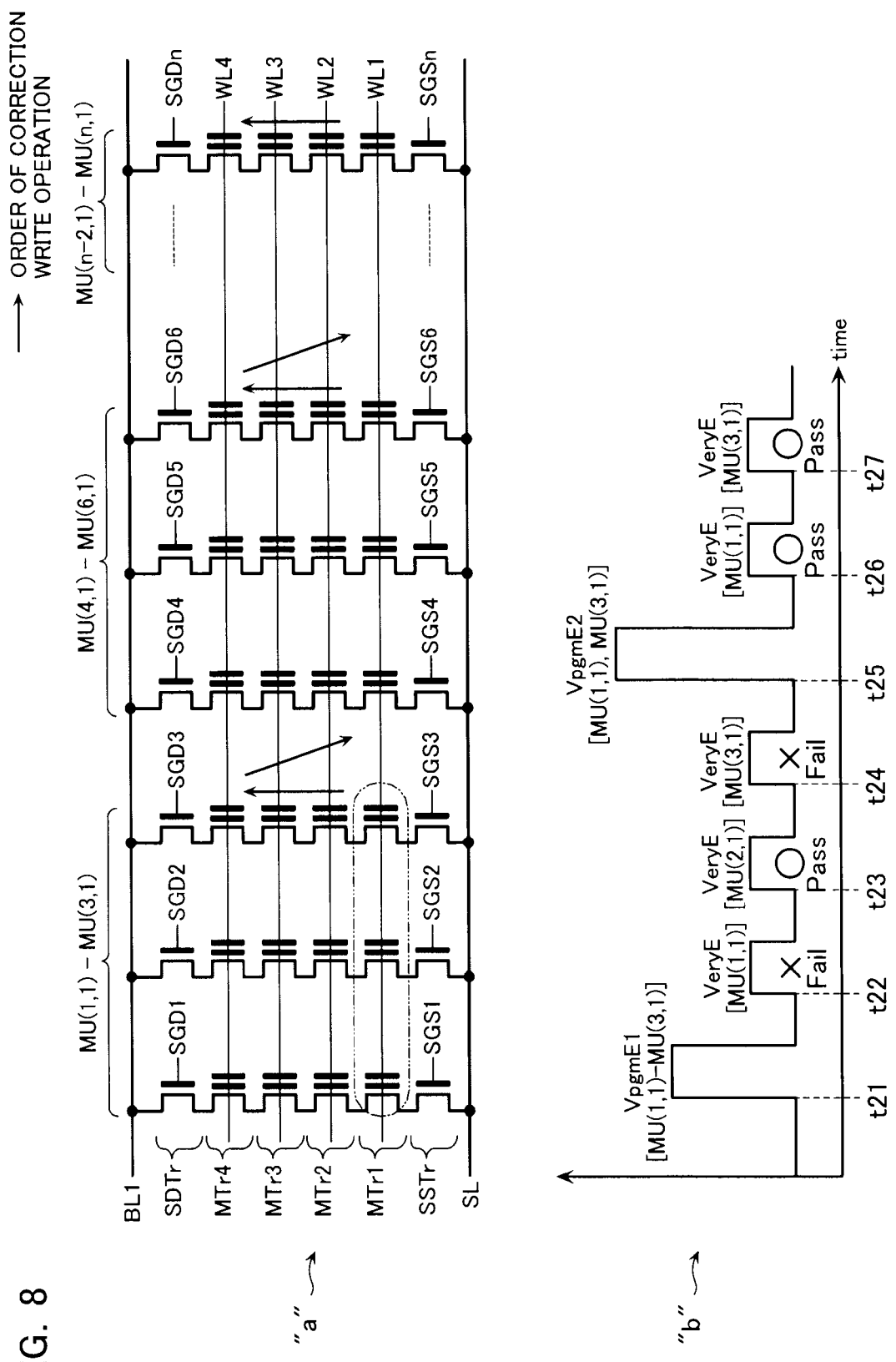
FIG. 8 is a view showing execution order of a correction write operation according to the first embodiment.

FIG. 8 corresponds to FIG. 7 in order to describe the correction writing in the present embodiment.

In this embodiment, the correction write operation is executed simultaneously with respect to the memory units MU connected to the single bit line BL. In this example, the memory units MU are three memory units MU(1, 1) to MU(3, 1).

In the correction writing, the voltage of the bit line BL is set to 0 V, and the voltage VDD is applied to the drain-side select gate lines SGD1 to SGD3 to bring the drain-side select transistors SDTr of the memory units MU(1, 1) to MU(3, 1) into the ON state. At the same time, 0 V is applied to the other drain-side select gate lines SGD4 to SGDn to bring the other drain-side select transistors SDTr into the OFF state. Further, 0 V is applied to the source-side select gate lines SGS to bring the source-side select transistor SSTr into the OFF state. Then, as shown in "b" of FIG. 8, the write voltage VpgmE1 is applied to the selected word line WL1 at a time t21, and, at the same time, the pass voltage Vpass is applied to the non-selected word lines WL2 to WL4. Consequently, the threshold voltage distribution of the memory transistor MTr1 of the memory units MU(1, 1) to MU(3, 1) is moved to the positive side.

Meanwhile, in the memory units MU(4,1) to MU(n, 1), the source-side select transistor SSTr and the drain-side select transistor SDTr are in the OFF state, whereby the memory transistor MTr1 is floated. Accordingly, even if the write voltage VpgmE1 is applied to the word line WL1, the body (channel) of the memory transistor MTr1 in the memory units MU(4,1) to MU(n, 1) is raised by coupling. Accordingly, high voltage is not applied to the charge accumulation layer of the memory transistor MTr1 in the memory units MU(4,1) to MU(n, 1), and no electron is injected into the charge accumulation layer.

Next, the write verify is performed. The write verify is performed in order of the memory units MU(1, 1), MU(2, 1), and MU(3, 1). The result of pass/fail is sequentially held by a latch circuit in a sense amplifier to be described later.

First, the voltage VDD is applied to the selected gate lines SGD1 and SGS1 to bring the select transistors SDTr and SSTr into the ON state, and the other select transistors SDTr and SSTr are brought into the OFF state, so that the sense only of the memory unit MU(1, 1) is executed. In this state, the write verify voltage VeryE is applied to the selected word line WL1 at a time t22, and, at the same time, the reading pass voltage Vread is applied to the non-selected word lines WL2 to WL4. Then, pass/fail is determined by a potential of the sense node of the sense amplifier.

Similar write verify is performed to the memory units MU(2, 1) and MU(3, 1). When a result of the write-verify reading is determined as fail, the write voltage VpgmE2 stepped up is applied to the selected word line WL1, and the correction write operation is carried on. As a result of the write-verify reading performed at times t26, t27, when there is a memory unit determined as pass, writing in the memory unit MU is inhibited thereafter, and, at the same time, the write verify is omitted.

When all the memory transistors MTr1 which are connected to the bit lines BL1 to BLn and are as an objects to be subjected to the correction writing becomes a pass state, the correction writing of the next memory transistor MTr2 is executed.

Here, there should be considered a processing performed when one of the memory units MU(i,j) and MU(i,k) connected to the same select gate lines SGD and SGS, and connected to different bit lines BL is subjected to the write operation, and the write operation is applied to the other memory unit. Thus, before the execution of the correction writing, the voltage of the body of the write inhibit memory transistor MTr in the write inhibit memory unit MU(i,j) is raised, whereby the writing operation applied to the write inhibit memory unit MU(i,j) is inhibited.

For example, as shown in "b" of FIG. 8, at times t22 to t25, only the memory unit MU(2, 1) of the memory units MU(1, 1) to MU(3, 1) connected to the bit line BL1 is determined as pass, and the memory units MU(1, 1) and MU(3, 1) are determined as fail. The correction write operation performed to the memory unit MU(2, 1) (write inhibit memory unit) is inhibited at the time t25. Also in this case, the correction write operation may be applied to the memory unit MU(2, 2) connected to the bit line BL2.

Figure 9:
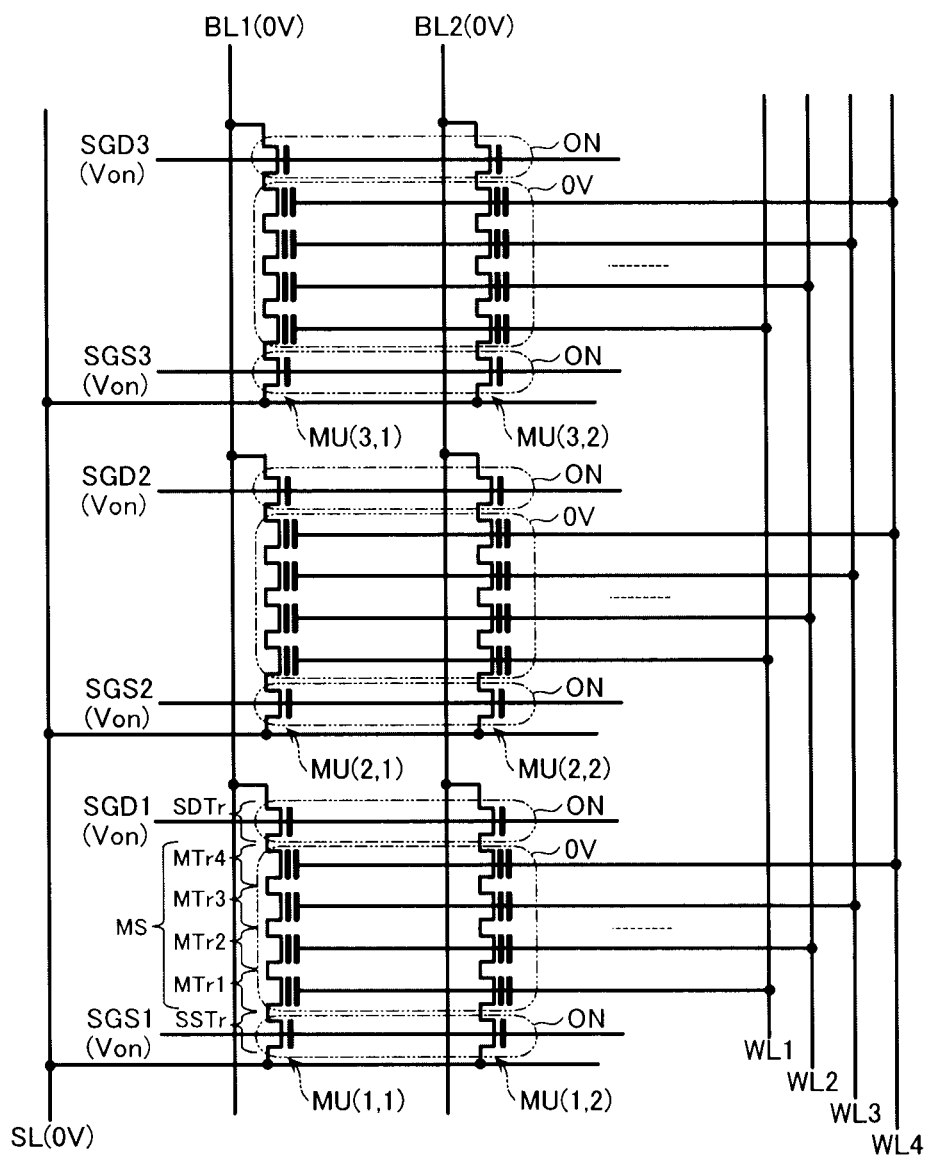
FIG. 9 is a view showing a write inhibit processing according to the first embodiment.
Figure 10:
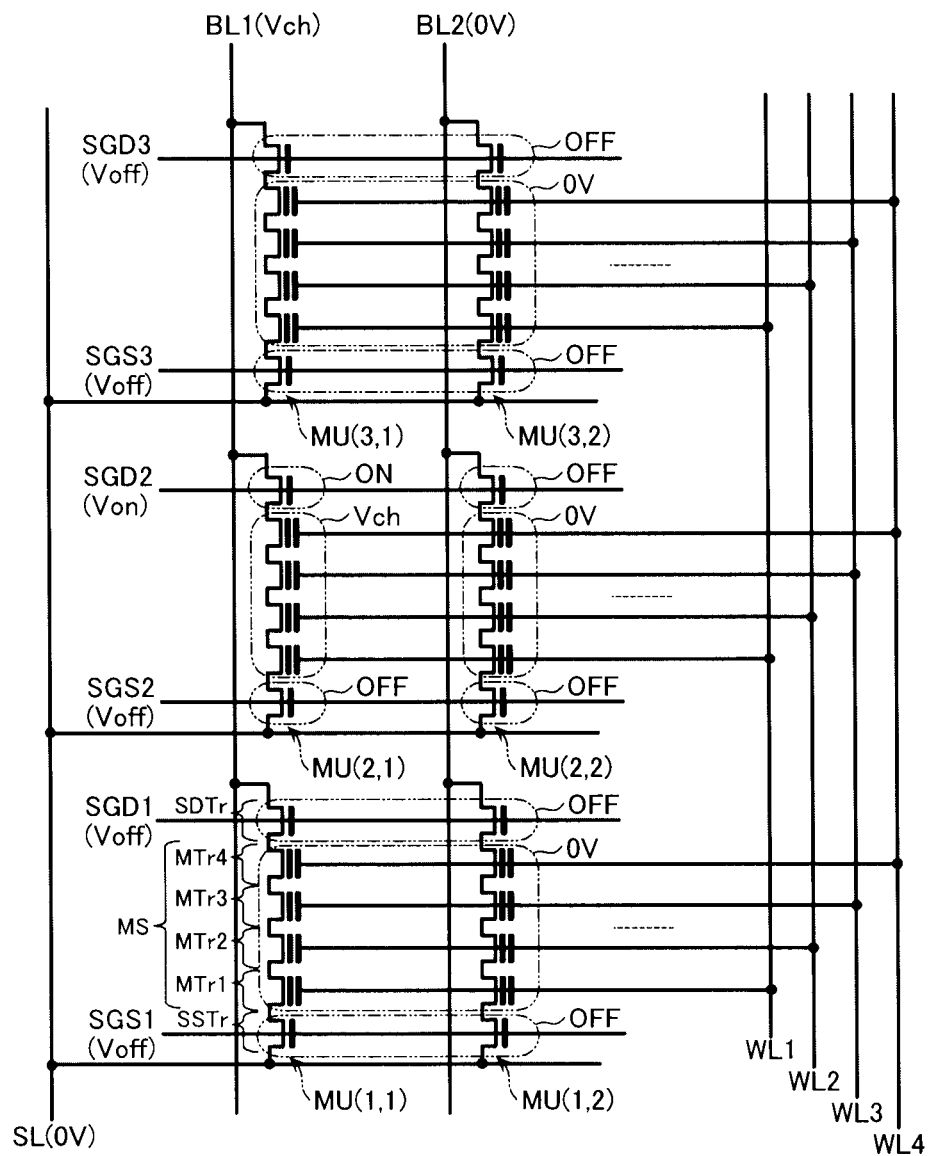
FIG. 10 is a view showing the write inhibit processing according to the first embodiment.

Next, write inhibit processing will be described with reference to FIGS. 9 and 10. The write inhibit processing is executed for inhibiting only a part of the correction write operation as described above. FIGS. 9 and 10 show only the memory units MU(1, 1) to MU(3, 1) and MU(1, 2) to MU(3, 2) as an example. In the write inhibit processing, first, as shown in FIG. 9, the voltage of the source line SL or the voltages of the bit lines BL1 and BL2 are set to 0 V. The voltages of the source-side select gate lines SGS1 to SGS3 and the drain-side select gate lines SGD1 to SGD3 are increased to a voltage Von. Consequently, the source-side select transistor SSTr and the drain-side select transistor SDTr in the memory units MU(1, 1) to MU(3, 1) and MU(1, 2) to MU(3, 2) are in a conductive state. As a result, the voltage of the body of the memory transistors MTr1 to MTr4 (memory string MS) in the memory units MU(1, 1) to MU(3, 1) and MU(1, 2) to MU(3, 2) is discharged to V. After that, the voltages of the source-side select gate lines SGS1 to SGS3 and the drain-side select gate lines SGD1 to SGD3 are lowered to a voltage Voff, whereby the source-side select transistor SSTr and the drain-side select transistor SDTr in the memory units MU(1, 1) to MU(3, 1) and MU(1, 2) to MU(3, 2) are in a nonconductive state.

Subsequently, as shown in FIG. 10, while the voltage of the bit line BL2 is held at 0 V, the voltage of the bit line BL1 is raised to a voltage Vch. The voltage of the drain-side select gate lines SGD2 is raised to the voltage Von, thereby only the drain-side select transistor SDTr in the memory unit MU(2, 1)

is in the conductive state. Consequently, only the bodies of the memory transistors MTr1 to MTr4 (memory string MS) in the memory units MU(2, 1) is charged to the voltage Vch from the bit line BL1.

The write inhibit processing shown in FIGS. 9 and 10 is executed before the time t25 in "b" of FIG. 8, whereby in the correction write operation at the time t25, high voltage is not applied to the gate of the memory transistors MTr1 to MTr4 in the memory unit MU(2, 1). Consequently, the correction write operation is inhibited to only the memory unit MU(2, 1).

The correction write operation is repeated, and after all the memory units MU(2, 1) and MU(2, 2) connected to the same select gate lines SGD2 and SGS2 are passed, the memory units MU(2, 1) and MU(2, 2) connected to the select gate lines SGD2 and SGS 2 are not verified.

Figure 11:
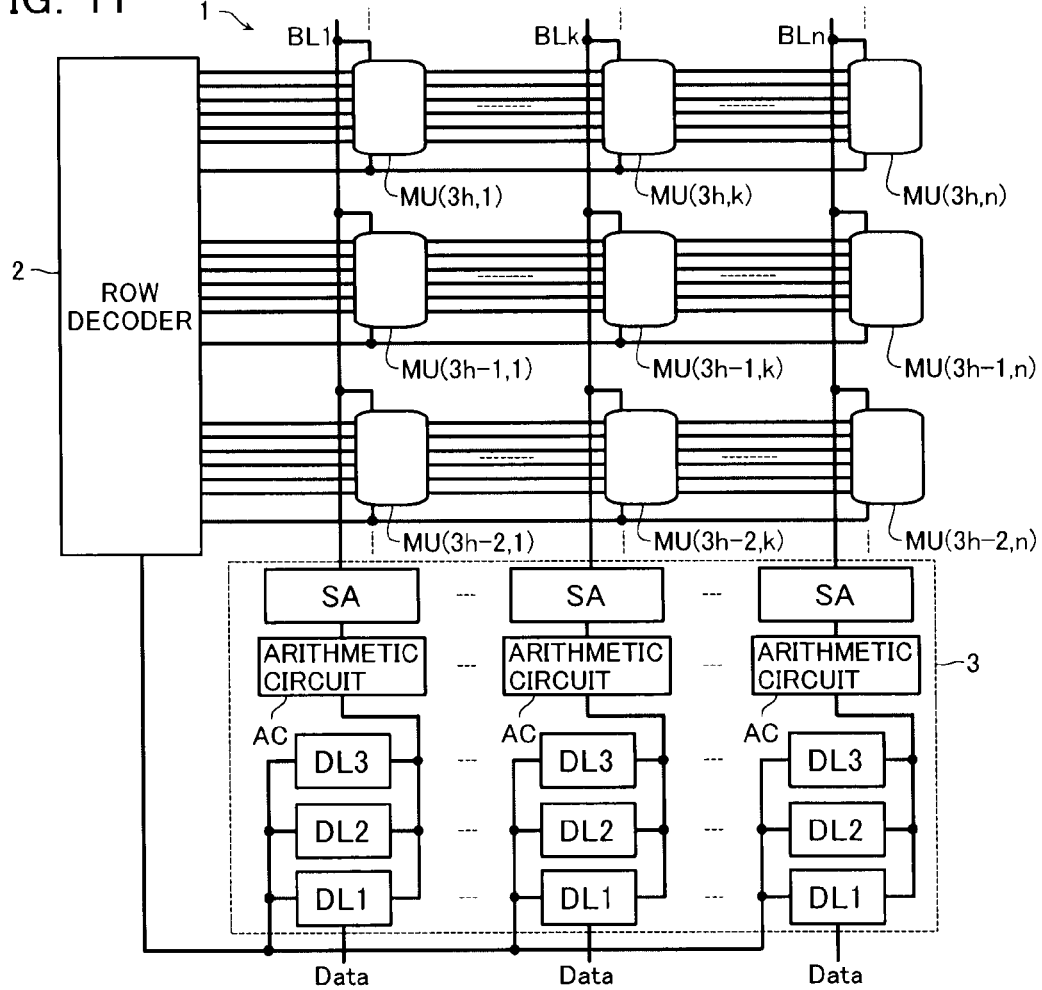
FIG. 11 is a block diagram showing a configuration of a sense amplifier 3 according to the first embodiment.

Next, a configuration of the sense amplifier 3 that allows to execute the correction write operation in the present embodiment will be described with reference to FIG. 11. In the memory of 2 bit/cell, as shown in FIG. 11, the sense amplifier 3 has plural sense amplifying portions SA, three data latch circuits DL1 to DL3 and an arithmetic circuit AC for calculation of a threshold level. The calculation of the threshold level is used in data writing and reading, and therefore, when a erase level E as a well-known threshold level is written, the three data latch circuits DL1 to DL3 are not required.

Thus, in the present embodiment, the correction write verify results of the three memory units MU are held using the three data latch circuits DL1 to DL3.

Figure 12:
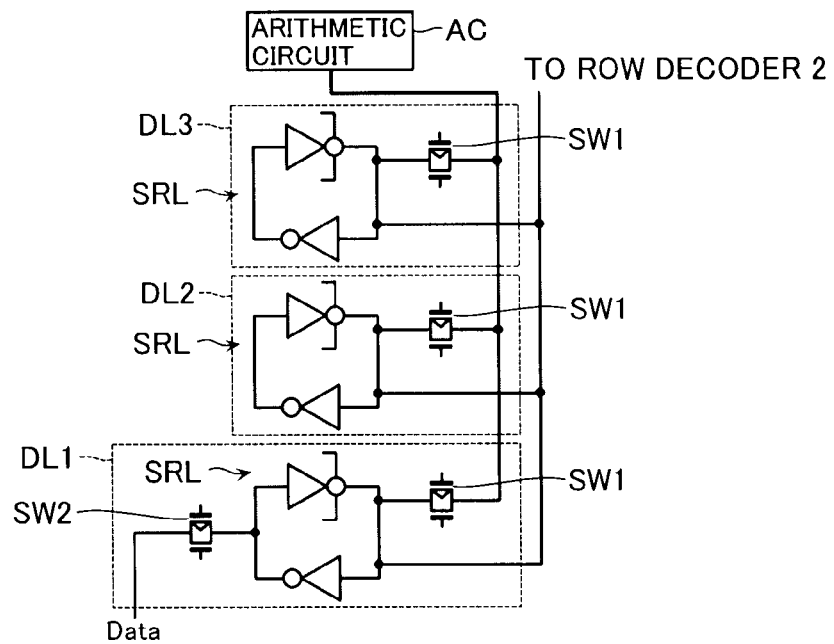
FIG. 12 is a circuit diagram showing an example of data latch circuits DL1 to DL3 according to the first embodiment.

The data latch circuits DL1 to DL3 each have an SR latch SRL and a switch SW1 as shown in FIG. 12, for example. The switch SW1 is provided between the arithmetic circuit AC and the SR latch SRL. The switch SW1 is in the conductive state when storing the determination result of the verify operation. The data latch DL1 further has a switch SW2. The switch SW2 is provided between an external input terminal and the SR latch SRL.

Second Embodiment

Although the present invention is applied to a nonvolatile semiconductor memory device comprising an I-like memory columnar semiconductor layer of the first embodiment, the present invention is applicable to a nonvolatile semiconductor memory device comprising a U-shaped memory semiconductor layer.

Another Embodiment

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a plurality of memory units each having a memory string which comprises memory transistors and select transistors;
a plurality of bit lines, one end of each of the memory units being connected to one of the plurality of bit lines;
a plurality of word lines connected to the memory transistors;
a plurality of control gate lines connected to the select transistors; and
a control circuit configured to control: an erase operation to erase data of the memory transistors; a correction write operation moving an erase threshold level of the memory transistors to a positive threshold level after the erase operation; and a correction write verify operation determining whether or not a threshold level of a result of the correction write operation reaches a first value,
in the correction write operation, the control circuit executing the correction write operation with respect to a group of the plurality of memory units connected to a common one of the bit lines and sequentially executing the correction write verify operation with respect to the group of the plurality of memory units in which the correction write operation is executed.

2. The nonvolatile semiconductor memory device according to claim 1, wherein
the memory string comprises:
a first semiconductor layer comprising a columnar portion extending in a vertical direction with respect to a substrate and functioning as bodies of the memory transistors;
a charge accumulation layer surrounding a side surface of the columnar portion and configured to enable to accumulate charges; and
a plurality of first conductive layers surrounding the side surface of the columnar portion through the charge accumulation layer and functioning as gates of the memory transistors,
each of the select transistors comprises:
a second semiconductor layer extending in a vertical direction with respect to a substrate and functioning as one of bodies of the select transistors;
a gate insulating layer surrounding a side surface of the second semiconductor layer; and
a second conductive layer surrounding the side surface of the second semiconductor layer through the gate insulating layer and functioning as one of gates of the select transistors.

3. The nonvolatile semiconductor memory device according to claim 1, wherein
the control circuit inhibits the correction write operation with respect to a memory transistor after a determination that a threshold level of a result of the correction write operation of the memory transistor reaches the first value by the correction write verify operation.

4. The nonvolatile semiconductor memory device according to claim 1, wherein
the control circuit comprises a plurality of latch circuits, and
the plurality of latch circuits each stores information regarding whether or not a threshold level of a result of the correction write operation reaches the first value.

5. The nonvolatile semiconductor memory device according to claim 1, wherein
the memory transistors are configured to enable to store multivalued data.

6. The nonvolatile semiconductor memory device according to claim 1, wherein
the control circuit comprises three latch circuits,
the three latch circuits each stores information regarding whether or not a threshold level of a result of the correction write operation reaches the first value, and the memory transistors are configured to enable to store data of 2 bits.

7. The nonvolatile semiconductor memory device according to claim 1, wherein
the control circuit executes the erase operation with respect to the group of the plurality of the memory units.

8. The nonvolatile semiconductor memory device according to claim 1, wherein
the control circuit applies a first voltage to gates of the memory transistors to execute the correction write operation and then applies a second voltage to the gates of the memory transistors to execute the correction write operation again, and
the second voltage is larger than the first voltage.

9. The nonvolatile semiconductor memory device according to claim 1, wherein
the control circuit sets a memory unit after a determination that a threshold level of a result of the correction write operation of the memory unit reaches the first value in the correction write verify operation to a write inhibit memory unit, and
the control circuit raises a voltage of a body of a memory transistor in the write inhibit memory unit before executing the correction write operation and thereby inhibits the correction write operation with respect to the write inhibit memory unit.

10. The nonvolatile semiconductor memory device according to claim 9, wherein
the control circuit discharges voltages of bodies of the memory transistors in the write inhibit memory unit and other memory units to a ground voltage and then charges the voltages of the bodies of the memory transistors in the write inhibit memory unit from the bit lines.

11. A nonvolatile semiconductor memory device comprising:
a plurality of memory units having a plurality of memory strings which comprises memory transistors and select transistors;
a plurality of bit lines, one end of each of the memory units being connected to one of the plurality of bit lines;
a plurality of word lines connected to the memory transistors;
a plurality of control gate lines connected to the select transistors; and
a control circuit configured to control: an erase operation to erase data of the memory transistors; a correction write operation moving an erase threshold level of the memory transistors to a positive threshold level after the erase operation; and a correction write verify operation determining whether or not a threshold level of a result of the correction write operation reaches a first value,
the memory string comprising:
a first semiconductor layer comprising a columnar portion extending in a vertical direction with respect to a substrate and functions as bodies of the memory transistors;
a charge accumulation layer surrounding a side surface of the columnar portion and configured to enable to accumulate charges; and
a plurality of first conductive layers surrounding the side surface of the columnar portion through the charge accumulation layer and function as gates of the memory transistors, and
in the correction write operation, the control circuit executing the correction write operation with respect to a group of the plurality of memory units connected to a common one of the bit lines.

12. The nonvolatile semiconductor memory device according to claim 11, wherein
the memory transistors are configured to enable to store multivalued data.

13. The nonvolatile semiconductor memory device according to claim 11, wherein
the control circuit executes the erase operation with respect to the group of the plurality of the memory units.

14. The nonvolatile semiconductor memory device according to claim 11, wherein
the control circuit applies a first voltage to the gates of the memory transistors to execute the correction write operation and then applies a second voltage to the gates of the memory transistors to execute the correction write operation again, and
the second voltage is larger than the first voltage.

15. The nonvolatile semiconductor memory device according to claim 11, wherein
the control circuit sets a predetermined memory unit to a write inhibit memory unit, and the control circuit raises a voltage of a body of a memory transistor in the write inhibit memory unit before executing the correction write operation and thereby inhibits the correction write operation with respect to the write inhibit memory unit.

16. The nonvolatile semiconductor memory device according to claim 15, wherein
the control circuit discharges voltages of bodies of the memory transistors in the write inhibit memory unit and other memory units to a ground voltage and then charges the voltages of the bodies of the memory transistors in the write inhibit memory unit from the bit lines.

17. A nonvolatile semiconductor memory device comprising:
a plurality of memory units each having a plurality of memory strings which comprises memory transistors and select transistors;
a plurality of bit lines extending in a first direction, one end of each of the memory units being connected to one of the plurality of bit lines;
a plurality of word lines connected to the memory transistors;
a plurality of control gate lines connected to the select transistors and extending in a second direction perpendicular to the first direction; and
a control circuit configured to control: an erase operation to erase data of the memory transistors; a correction write operation moving an erase threshold level of the memory transistors to a positive threshold level after the erase operation; and a correction write verify operation determining whether or not a threshold level of a result of the correction write operation reaches a first value,
in the correction write operation, the control circuit executing the correction write operation with respect to a group of the plurality of the memory units connected to a common one of the bit lines and sequentially executing the correction write verify operation with respect to the plurality of memory units in which the correction write operation is executed, and the correction write verify operation being executed for each of the memory units connected to a common control gate line.

18. The nonvolatile semiconductor memory device according to claim 17, wherein
after all the memory units connected to the common control gate line are determined as pass by the correction write verify operation, the correction write verify operation applied to the memory units connected to the common control gate line is omitted.

* * * * *